United States Patent
Yoon

(10) Patent No.: US 6,940,122 B2
(45) Date of Patent: Sep. 6, 2005

(54) FLASH EEPROM UNIT CELL AND MEMORY ARRAY ARCHITECTURE INCLUDING THE SAME

(75) Inventor: Sukyoon Yoon, Saratoga, CA (US)

(73) Assignee: Terra Semiconductor, Inc., Seoul (KR)

( * ) Notice: Subject to any disclaimer, the term of this patent is extended or adjusted under 35 U.S.C. 154(b) by 16 days.

(21) Appl. No.: 10/689,722

(22) Filed: Oct. 22, 2003

(65) Prior Publication Data

US 2004/0079972 A1 Apr. 29, 2004

Related U.S. Application Data

(60) Provisional application No. 60/420,672, filed on Oct. 22, 2002.

(51) Int. Cl.[7] .............................................. H01L 29/788
(52) U.S. Cl. ........................ 257/315; 257/314; 257/316; 257/320; 257/321; 257/322; 257/326
(58) Field of Search ................................. 257/239, 261, 257/298, 315–326; 438/201, 211, 216, 241, 257, 258, 260–266, 591, 593

(56) References Cited

U.S. PATENT DOCUMENTS

| | | | | |
|---|---|---|---|---|
| 5,429,960 A | * | 7/1995 | Hong | 438/261 |
| 5,460,991 A | * | 10/1995 | Hong | 438/261 |
| 5,532,181 A | * | 7/1996 | Takebuchi et al. | 438/258 |
| 5,750,428 A | * | 5/1998 | Chang | 438/264 |
| 5,953,254 A | * | 9/1999 | Pourkeramati | 365/185.26 |
| 6,621,130 B2 | * | 9/2003 | Kurokawa et al. | 257/390 |
| 6,642,105 B2 | * | 11/2003 | Kim et al. | 438/257 |
| 6,759,706 B2 | * | 7/2004 | Kobayashi | 257/314 |
| 6,815,283 B2 | * | 11/2004 | Lee | 438/211 |

* cited by examiner

*Primary Examiner*—Andy Huynh
(74) *Attorney, Agent, or Firm*—Staas & Halsey LLP

(57) ABSTRACT

A high-density flash EEPROM (Electrically Erasable Programmable Read Only Memory) unit cell and a memory array architecture including the same are disclosed. The flash EEPROM unit cell comprises a substrate on which field oxide layers are formed for isolating unit cells, a floating gate dielectric layer formed between the adjacent field oxide layers, wherein the floating gate dielectric layer includes a first dielectric layer and a second dielectric layer which are connected in parallel between a source and a drain formed on the substrate, and the thickness of the first dielectric layer is thicker than the second dielectric layer, a floating gate formed on the floating gate dielectric layer, a control gate dielectric layer formed on the floating gate; and a control gate formed on the control gate dielectric layer.

15 Claims, 6 Drawing Sheets

FLASH EEPROM UNIT CELL AND MEMORY ARRAY ARCHITECTURE INCLUDING THE SAME

PRIORITY UNDER 35 U.S.C. §119(e) & 37 C.R.F. §1.78

This nonprovisional application claims priority based upon the following prior U.S. provisional patent application entitled: FLASH EEPROM CELL STRUCTURE, Application No.: 60/420,672, filed on Oct. 22, 2002, in the name of: Sukyoon Yoon, which is hereby incorporated by reference for all purposes.

FIELD OF THE INVENTION

The present invention relates to a nonvolatile semiconductor memory, and more particularly, to a high-density flash EEPROM (Electrically Erasable Programmable Read Only Memory) unit cell and a memory array architecture including the same.

BACKGROUNDS OF THE INVENTION

Generally, semiconductor memories are categorized into volatile memories that lose data when power is turned off and nonvolatile memories that maintain data even when power is turned off. The nonvolatile memories include EPROMs (Erasable Programmable Read Only Memories), EEPROMs (Electrically EPROMs) and flash EEPROMs. Flash EEPROMs, developed form of conventional EEPROMs, have both an advantage of small cell-size, which is the feature of conventional EPROM and an advantage of being electrically erased, which is the feature of EEPROM. Therefore, the demand for flash EEPROM devices is increasing in the industries.

Flash EEPROM devices are classified into NAND-type flash EEPROM devices and NOR-type flash EEPROM devices according to memory logic array architecture including unit cells. The unit cell of flash EEPROM devices includes a source and a drain formed on a substrate, and a stack-gate which is formed between the source and the drain, and composed of a floating gate and a control gate.

FIG. 1 is a schematic circuit diagram of a conventional NAND-type flash EEPROM device. As shown in FIG. 1, the NAND-type flash EEPROM device is constructed with a plurality of memory strings, a plurality of bit lines BL1 and BL2 and a plurality of word lines WL1, WL2, . . . , WL15 and WL16 which intersect the bit lines BL1 and BL2. Each memory string includes a plurality of unit cells MCa connected in series, a first selection transistor DST serially connected to the first unit cell of the plurality of unit cells and also connected to a bit line BL1 or BL2 and the second selection transistor SST serially connected to the last unit cell of the plurality of unit cells and also connected to a common source line SL. Each unit cell MCa of the memory string is connected to the respective word line WL1, WL2, . . . , WL15 or WL16, the gate of the first selection transistor DST is connected to a drain selection line DSL, and the gate of the second selection transistor SST is connected to a source selection line SSL.

FIG. 2a is a plan layout for illustrating the unit cell structure of the NAND-type flash EEPROM device shown in FIG. 1, and FIG. 2b and FIG. 2c are cross-sectional views taken on line I—I (channel direction) and line II—II (word line direction) of FIG. 2a, respectively. As shown in FIGS. 2a–2c, a source 12 and a drain 13 are formed in the active region of a substrate 11, and a stack gate consisting of a tunnel oxide 14, a floating gate 15, an dielectric layer 16 and a control gate 17 is formed on a channel between the source 12 and the drain 13. An insulating interlayer 18 covers the stack gate and the substrate 11. The plurality of bit line layers 19 are formed in parallel with the memory strings on the insulating interlayer 18. The plurality of word line layers (not shown) are formed in parallel with the control gate 17, and in perpendicular with the bit line layers 19. Also, as most apparently shown in FIG. 2c, the unit cells MCa in the word line direction are electrically separated from the adjacent unit cells MCa by a field oxide layer 20, and the width 20a between the field oxide layers 20 corresponds to the width of the active region.

In the conventional unit cell MCa of the flash EEPROM, the width d of the floating gate 15 is larger than the width 20a of the active region, and thus the floating gate 15 partially overlaps the field oxide layer 20 to increase a gate coupling ratio (GCR). The GCR is important in determining the operating voltage of the unit cell, and can be expressed by the following equation.

$$GCR = \frac{C1}{C1 + C2} \quad \text{[Equation 1]}$$

In equation 1, C1 represents a capacitance between the floating gate 15 and the control gate 17, and C2 represents a capacitance between the floating gate 15 and the substrate 11. Capacitance is proportional to the dielectric constant and the area of a dielectric layer and is inversely proportional to the thickness of the dielectric layer.

In order to reduce the control voltage for programming or erasing data in the unit cell Mca, the GCR value should be increased. Referring to Equation 1 and FIG. 2C, the GCR value can be increased by increasing the dielectric constant of the dielectric layer 16 between the floating gate 15 and the control gate 17, by reducing the thickness of the dielectric layer 16, or by increasing the overlapping area of the control gate 17 and the floating gate 15. However, the first method is difficult to realize because this method needs a new dielectric material. The second method is also difficult to realize because the dielectric layer 16 should insulate the control gate 17 and the floating gate 15 even when a high voltage is applied to the control gate 17 and the floating gate 15 in the programming mode and the erase mode of the unit cell. Therefore, the third method has been mainly used to increase the GCR value. For example, as shown in FIG. 2c, the floating gate 15 extends over the field oxide layer 20 so that overlapping area of control gate 17 and the floating gate 15 increases. In this case, the width t of the cell isolation region is smaller than the width 20b of the field oxide layer 20. Accordingly, though the isolation region having the minimum width t can be produced with an up-to-date photo process equipment, the width 20b of the field oxide layer 20 must be larger than the minimum width t of the isolation region in order to increase the GCR value. Due to the overlap of the floating gate 15 and the field oxide layer 20, the unit cell cannot be produced to have the minimum size, which raises the manufacturing cost of the flash EEPROM device, and also becomes an obstacle in developing a high-density flash EEPROM device.

As other method for decreasing the distance between the active regions, polysilicon spacers can be employed in the unit cell structure of the flash EEPROM device. However, the distance between the active regions cannot be minimized even though the polysilicon spacer is used. In addition, this method has drawbacks in that it requires additional processes to form the polysilicon spacers, and a high manufacturing cost in producing the flash EEPROM devices. The above-mentioned problems are also shown in the NOR-type flash EEPROM devices because the NOR-type flash EEPROM devices also uses the unit cell having the same structure with that of the NAND-type flash EEPROM devices.

SUMMARY OF THE INVENTION

It is an object of the present invention to provide a flash EEPROM unit cell having a reduced cell size while maintaining the GCR value of a conventional flash EEPROM unit cell and a memory array architecture including the same.

It is other object of the present invention to provide a flash EEPROM unit cell suitable for the high-density memory device and a memory array architecture including the same.

It is another object of the present invention to provide a flash EEPROM unit cell capable of minimizing the width between the active regions and a memory array architecture including the same.

In order to achieve these and other objects, the present invention provides a new flash EEPROM unit cell. The flash EEPROM unit cell according to the present invention comprises a substrate on which field oxide layers are formed for isolating unit cells, a floating gate dielectric layer formed between the adjacent field oxide layers, wherein the floating gate dielectric layer includes a first dielectric layer and a second dielectric layer which are connected in parallel between a source and a drain formed on the substrate, and the thickness of the first dielectric layer is thicker than the second dielectric layer, a floating gate formed on the floating gate dielectric layer, a control gate dielectric layer formed on the floating gate; and a control gate formed on the control gate dielectric layer.

The present invention also provides a NAND-type flash EEPROM array architecture comprising a plurality of bit lines, a plurality of word lines which intersect the plurality of bit lines; and a memory string including a plurality of unit cells serially connected to one of the bit lines, wherein each of the unit cells is connected to a respective word line, and the unit cell includes a first sub-cell and a second sub-cell connected in parallel between a source and a drain, and a capacitance of a dielectric layer under a floating gate of the first sub-cell is smaller than that of dielectric layer under a floating gate of the second sub-cell.

The present invention further provides a NOR-type flash EEPROM array architecture comprising a plurality of bit lines, a plurality of word lines which intersect the plurality of bit lines; and a plurality of unit cells formed at the intersection of the bit lines and the word lines; wherein the unit cells at a row are connected to a word line; each of the unit cells includes a first sub-cell and a second sub-cell connected in parallel between a source and a drain; the sources of the unit cells are connected to a common source line; the drains of the unit cells at a column is connected to a bit line; and a capacitance of dielectric layer under a floating gate of the first sub-cell is smaller than that of dielectric layer under a floating gate of the second sub-cell.

DETAILED DESCRIPTION OF THE INVENTION

A more complete appreciation of the invention and many of the attendant advantages thereof can be better appreciated by reference to the following detailed description and the accompanying drawings.

Figure 1:
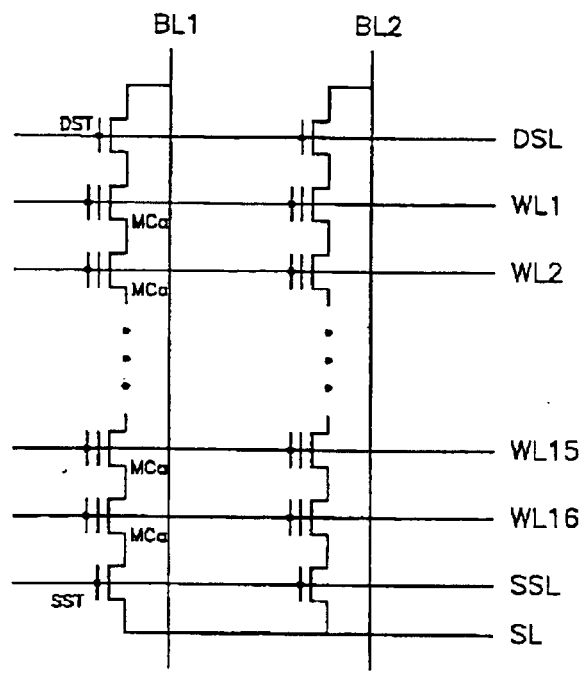
FIG. 1 is a schematic circuit diagram of a conventional NAND-type flash EEPROM device.
Figure 3:
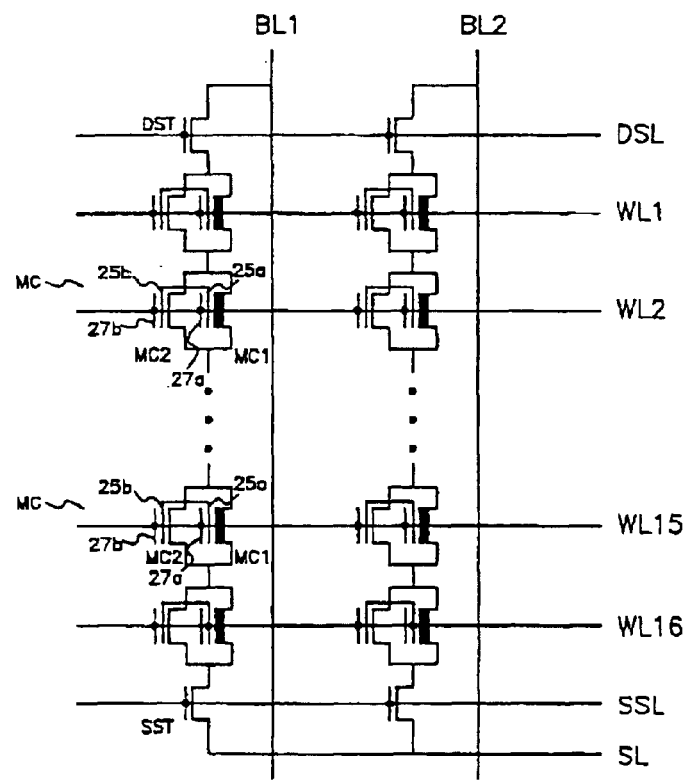
FIG. 3 is a schematic circuit diagram of a NAND-type flash EEPROM device including a unit cell according to an embodiment of the present invention.

FIG. 3 shows a schematic circuit diagram of a NAND-type flash EEPROM device including a unit cell according to an embodiment of the present invention. Referring to FIG. 3, the flash EEPROM device according to the present invention is different from the conventional flash EEPROM device shown in FIG. 1 in that the unit cell MC of the present invention includes the first sub-cell MC1 and the second sub-cell MC2 connected in parallel. In the unit cell MC of the present invention, the control gate 27a of the first sub-cell MC1 and the control gate 27b of the second sub-cell MC2 are connected to the same word line, and the floating gate 25a of the first sub-cell MC1 is connected to the floating gate 25b of the second sub-cell MC2. In addition, the capacitance of the dielectric layer under the floating gate 25a of the first sub-cell MC1 is formed to be smaller than that of the dielectric layer under the floating gate 25b of the second sub-cell MC2.

Figure 4A:
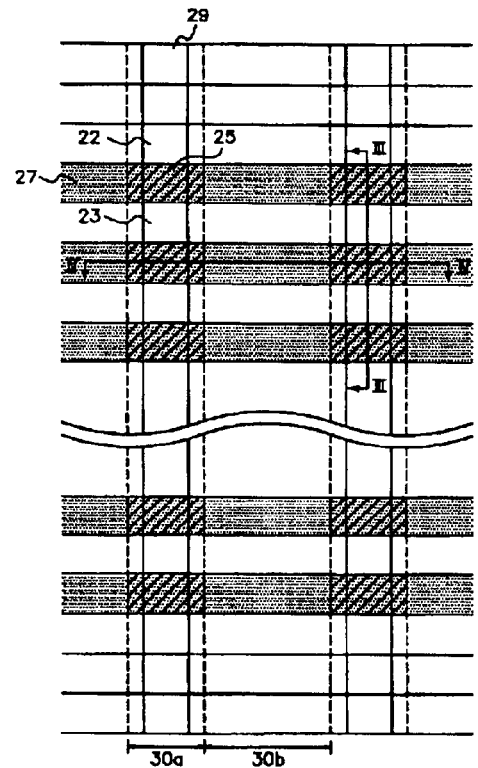
FIG. 4a is a plan layout for illustrating the unit cell structure of the NAND-type flash EEPROM device according to an embodiment of the present invention.
Figure 4B:
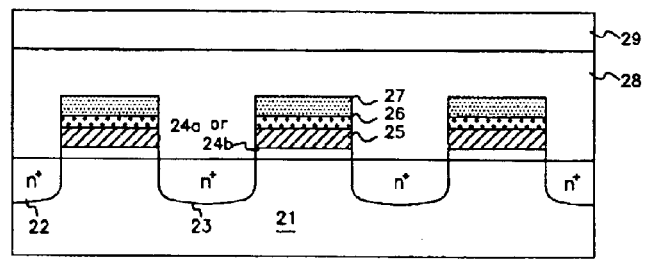
FIG. 4b and FIG. 4c are cross-sectional views taken on line III—III (channel direction) and line IV—IV (word line direction) of FIG. 4a, respectively.
Figure 4C:
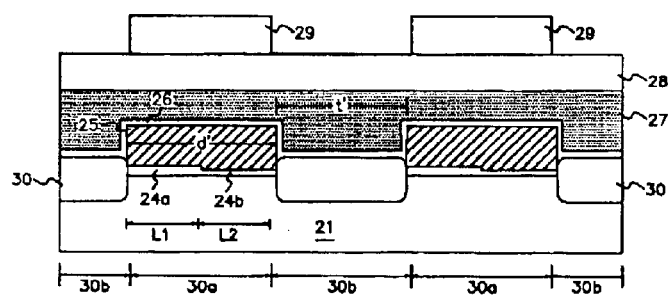

FIG. 4a shows a plan layout for illustrating the unit cell structure of the NAND-type flash EEPROM device shown in FIG. 3, and FIG. 4b and FIG. 4c are cross-sectional views taken on line III—III (channel direction) and line IV—IV (word line direction) of FIG. 4a, respectively. As shown in FIGS. 4a–4c, a n+ type source 22 and a n+ type drain 23 are formed in the active region of a p type substrate 21, and a floating gate dielectric layer comprising the first dielectric layer 24a and the second dielectric layer 24b is formed on a channel between the source 22 and the drain 23. On the floating gate dielectric layer, a floating gate 25, a control gate dielectric layer 26 and a control gate 27 are sequentially formed. And an insulating interlayer 28 is formed on the control gate 27 and the substrate 21, and bit line layers 29 are formed on the insulating interlayer 28 in parallel to the memory strings. In the NAND-type flash EEPROM device shown in FIGS. 4a–4c, the floating gate 25 formed in the active region 30a carries out the functions of the floating gate 25a of the first sub-cell MC1 and the floating gate 25b of the second sub-cell MC2 shown in FIG. 3. The control gate 27 formed on the floating gate 25 carries out the functions of the control gate 27a of the first sub-cell MC1 and the control gate 27b of the second sub-cell MC2 shown in FIG. 3.

As shown in FIG. 4c, the field oxide layer 30 for electrically isolating unit cells is formed on the substrate 21. The first dielectric layer 24a and the second dielectric layer 24b which forms the floating gate dielectric layer are positioned between the adjacent field oxide layers 30, and are connected in parallel between the source 22 and the drain 23. The second dielectric layer 24b is for inducing electron-injection into the floating gate 25 and electron-emission from the floating gate 25, and plays the same role as a tunneling oxide layer in the conventional flash EEPROM device. Thus the thickness of the second dielectric layer 24b is substantially equal to that of the tunneling oxide layer. The first dielectric layer 24a is thicker than that of the second dielectric layer 24b so that total capacitance of the floating gate dielectric layer is reduced. Therefore, the GCR can be increased if the capacitance C1 between the floating gate 25 and the control gate 27 is maintained (See Equation 1,), or it is capable of reducing the capacitance C1 between the floating gate 25 and the control gate 27 while maintaining the GCR value. That is, the overlap of the floating gate 25 and the field oxide layer 30 for increasing the GCR is not necessary in the present invention, and thus the width d' of the floating gate 25 can be reduced as shown in FIG. 4c. The thickness and width of the first dielectric layer 24a can be varied in the condition that the total capacitance C2 of the floating gate dielectric layer is reduced. Preferably, the first dielectric layer 24a is formed to have the same thickness with the dielectric layer of the peripheral devices formed in the flash EEPROM device to control the flash EEPROM device. In this case, the flash EEROM device can be manufactured with the reduced processing steps. In addition, it is preferable that the width L1 of the first dielectric layer 24a is substantially identical with the width L2 of the second dielectric layer 24b. In this case, the surface area of the first dielectric layer 24a and the surface area of the second dielectric layer 24b are the same, which provides enough process margins, and effectively reduces the capacitance C2 of the floating gate dielectric layer.

Therefore, as shown in FIG. 4c, the width 30a of the active region of the flash EEPROM unit cell according to an embodiment of the present invention is equal to the width d' of the floating gate 25, and the width 30b of the field oxide layer 30, namely, the distance between the adjacent active regions, is equal to the width t' of the isolation region. In other words, the floating gate 25 in the flash EEPROM unit cell according to an embodiment of the present invention is formed only on the active region 30a and on the first dielectric layer 24a and the second dielectric layer 24b. Thus, in the present invention, the floating gate 25 does not overlap with the field oxide layer 30. The width t' of the isolation region can be the same with the width t of the isolation region of the conventional flash EEPROM device. In this case, the field oxide layer 30 can be manufactured so as to have a smaller width than the width 20b of the field oxide layer 20 of the conventional flash EEPROM device. Further, the active region 30a and the isolation region 30b can be minimized, and the integrated-density of the flash EEPROM device can be improved.

Figure 2A:
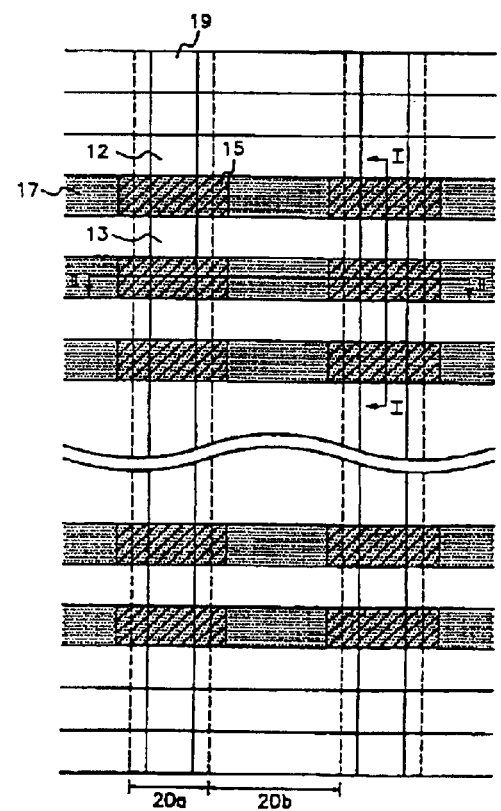
FIG. 2a is a plan layout for illustrating the conventional unit cell structure of the NAND-type flash EEPROM device.
Figure 2B:
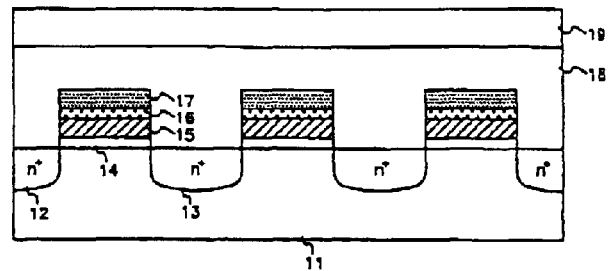
FIG. 2b and FIG. 2c are cross-sectional views taken on line I—I (channel direction) and line II—II (word line direction) of FIG. 2a, respectively.
Figure 2C:
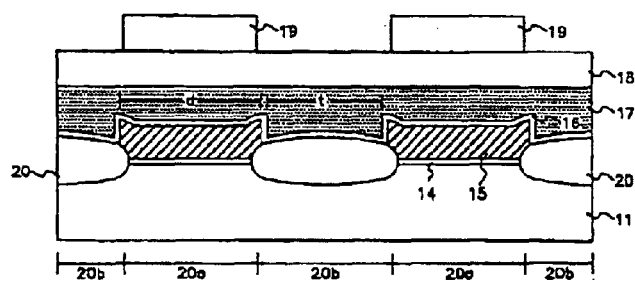

In the conventional flash EEPROM unit cell shown in FIG. 2a, if the width of the floating gate 15 is reduced, the capacitance C1 between the floating gate 15 and the control gate 17 is also reduced, and thus the GCR value is decreased. Then the operating voltage should be increased to obtain a voltage for inducing Fowler-Nordheim tunneling, which reduces the life-time of the flash EEPROM device, and the operational reliability of the flash EEPROM device is deteriorated. In the present invention, the reduction of GCR value is avoided by reducing the capacitance C2 of the floating gate dielectric layer 24a and 24b. In the present invention, the thickness and area of the floating gate dielectric layer 24a and 24b can be properly adjusted so that the increase of the GCR value due to the increase of the thickness of the floating gate dielectric layer 24a and 24b is same with the reduction of the GCR value due to the reduction of overlapping area of the control gate 27 with the floating gate 25. Therefore, the size of unit cell of the flash EEPROM device can be reduced while maintaining the GCR value of the conventional flash EEPROM device. For example, in the conditions of (i) the thickness of the second dielectric layer 24b is equal to that of the floating gate dielectric layer (a tunnel oxide layer) of the conventional flash EEPROM device, (ii) the first dielectric layer 24a is two times thicker than the second dielectric layer 24b, (iii) the surface areas of the first dielectric layer 24a and the second dielectric layer 24b are same, (iv) the materials of the first dielectric layer 24a and the second dielectric layer 24b are the same as that of the dielectric layer of the conventional flash EEPROM device, and (v) the capacitance of the first dielectric layer 24a is C, the capacitance C2 of the unit cell according to the present invention is 3C, and the capacitance C2 of the conventional unit cell is 4C. That is, in the present invention, the GCR value is increased because of the reduction of denominator in Equation 1.

Among the nonvolatile semiconductor memories, there are conventional EEPROM devices whose oxide layer formed under the floating gate is composed of a relatively thin oxide layer and a relatively thick oxide layer serially connected to each other between a source and a drain of the conventional EEPROM device. The relatively thick oxide layer is for sensing a threshold voltage of the conventional EEPROM device and the relatively thin oxide layer is for programming and erasing modes. However, the conventional EEPROM device is different from the present flash EEPROM device. The conventional EEPROM device has a negative threshold voltage after the programming mode. So, the additional transistor for selecting gates of 2 sub-cells of the EEPROM cell serially connected is needed, and the integrated-density of the EEPROM is not enhanced. Also, the GCR of the EEPROM device is reduced.

In operation of the present flash EEPROM device, electron injection into the floating gate 25 and electron emission therefrom is carried out through the second dielectric layer 24b of a relatively thin thickness. Though the area for Fowler-Nordheim tunneling is reduced due to the first dielectric layer 24a of a relatively thick thickness, the speed for programming and erasing is not affected by the first dielectric layer 24a.

Figure 5:
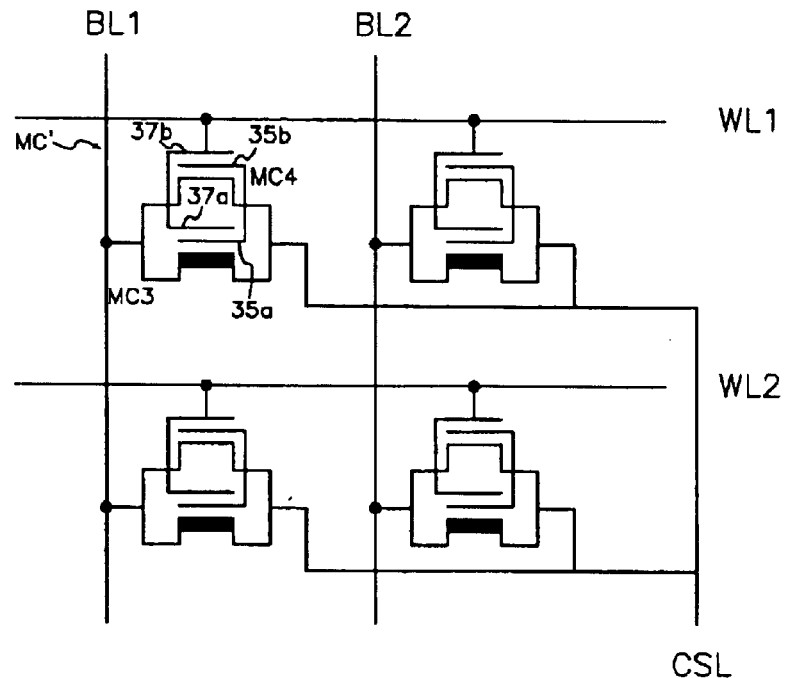
FIG. 5 is a schematic circuit diagram of a NOR-type flash EEPROM device including a unit cell according to an embodiment of the present invention.

The unit cell of flash EEPROM device according to the present invention can be applied to not only NAND-type flash EEPROM array architecture of FIGS. 4a–4c but also NOR-type flash EEPROM array architecture. FIG. 5 is a schematic circuit diagram of a NOR-type flash EEPROM device including a unit cell according to an embodiment of the present invention. As shown in FIG. 5, the NOR-type flash EEPROM device includes a plurality of bit lines BL1 and BL2, a plurality of word lines WL1, WL2, . . . , WL15 and WL16 which intersect the plurality of bit lines BL1 and BL2, and a plurality of unit cells MC' formed at the intersection of the bit lines BL1 and BL2 and the word lines WL1, WL2, . . . , WL15 and WL16. Sources of a plurality of unit cells MC' are connected to a common source line CSL. Drains of the unit cells MC' at the same column are connected to a single bit line BL1 or BL2, and control gates of the unit cells MC' at the same row are connected to single word line WL1, WL2, . . . , WL15 or WL16.

Here, the unit cell MC' includes the first sub-cell MC3 and the second sub-cell MC4 connected in parallel, like the unit cell MC of the NAND-type flash EEPROM device. In detail, the control gate 37a of the first sub-cell MC3 and the control gate 37b of the second sub-cell MC4 are connected to the same word line, and the floating gate 35a of the first sub-cell MC3 is connected to the floating gate 35b of the second sub-cell MC4. Capacitance of the dielectric layer under the floating gate 35a of the first sub-cell MC3 is smaller than that of the dielectric layer under the floating gate 35b of the second sub-cell MC4.

Figure 6A:
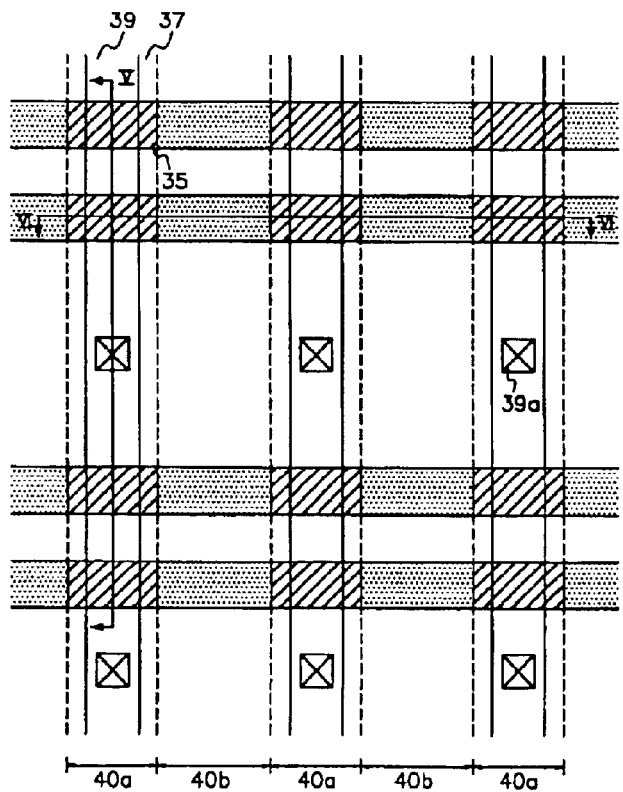
FIG. 6a is a plan layout for illustrating the unit cell structure of the NOR-type flash EEPROM device according to one embodiment of the present invention.
Figure 6B:
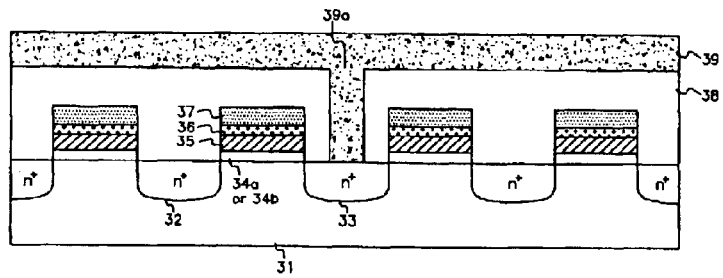
FIG. 6b and FIG. 6c are cross-sectional views taken on line V—V (channel direction) and line VI—VI (word line direction) of FIG. 6a, respectively.
Figure 6C:
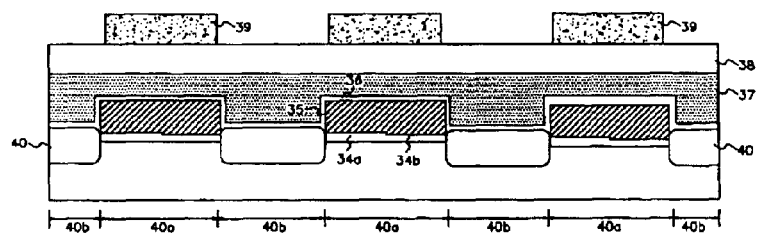

FIG. 6a shows a plan layout for illustrating the unit cell structure of the NOR-type flash EEPROM device shown in FIG. 5, and FIG. 6b and FIG. 6c are cross-sectional views taken on line V—V (channel direction) and line VI—VI (word line direction) of FIG. 6a, respectively. As shown in FIGS. 6a–6c, the floating gate 35 formed in the active region 40a carries out the functions of the floating gate 35a of the first sub-cell MC3 and the floating gate 35b of the second sub-cell MC4 shown in FIG. 5. The control gate 37 formed on the floating gate 35 carries out the functions of the control gate 37a of the first sub-cell MC3 and the control gate 37b of the second sub-cell MC4 shown in FIG. 5. As shown in FIG. 6b, a cross-sectional view of unit cell of the NOR-type flash EEPROM device along the channel is similar to that of unit cell of the conventional NOR-type flash EEPROM device except for one thing. That is, either the first dielectric layer 34a whose thickness is more than that of the dielectric layer (tunneling oxide layer) under the floating gate of unit cell of the conventional NOR-type flash EEPROM or the second dielectric layer 34b whose thickness is equal to that of the dielectric layer (tunneling oxide layer) under the floating gate of unit cell of the conventional NOR-type flash EEPROM, is shown according to a position of line V—V. Also, as shown in FIG. 6c, cross-sectional view of unit cell of the NOR-type flash EEPROM device along the gate or the word line is similar to that of unit cell of the conventional NOR-type flash EEPROM device except for the following matters. That is, the floating gate 35 is formed only on the active region and does not overlap with the field oxide layer 40, and the dielectric layer under the floating gate 35 is consisted of the first dielectric layer 34a and the second dielectric layer 34b having different thickness from each other.

Figure 7A:
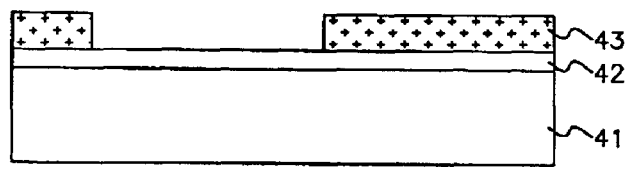
FIGS. 7a–7e are cross-sectional views illustrating the processes of forming the unit cell of the flash EEPROM device according to an embodiment of the present invention.
Figure 7B:
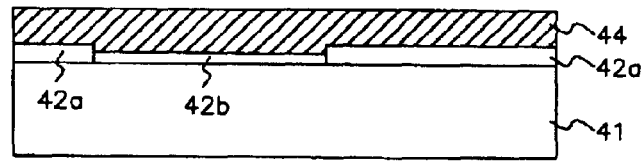
Figure 7C:
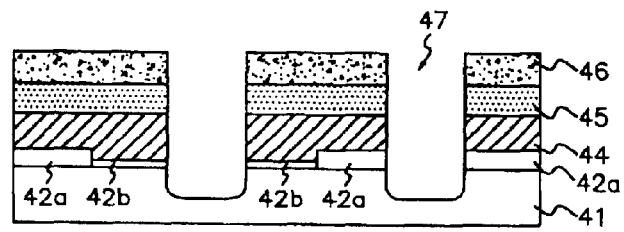

Next, referring to FIGS. 7a–7e, the process for forming the unit cell of the flash EEPROM device according to an embodiment of the present invention will be explained. As shown in FIG. 7a, a dielectric layer 42 is formed on a substrate 41, and a photo resist pattern 43 is formed on the dielectric layer 42. The thickness of the dielectric layer 42 can be varied in accordance with the design rule. Preferably, the thickness of the dielectric layer 42 may be equal to that of dielectric layer of the peripheral devices formed in the flash EEPROM device to control the flash EEPROM device. As shown in FIG. 7b, the exposed portion of the dielectric layer 42 is etched by using the photo resist pattern 43 as a etch mask to form dual dielectric layers including a thick dielectric layer 42a and a thin dielectric layer 42b. Thereafter the photo resist pattern 43 is removed and then a first polysilicon with PoCl$_3$ is deposited to form the first conductive layer 44. Here, the thickness of the thin dielectric layer 42a is about 9 nm, which corresponds to the typical thickness of the conventional tunneling oxide layer. Next, a silicon nitride layer 45 formed by CVD (chemical vapor deposition) and an etch mask 46 for defining an isolation region are sequentially formed on the first conductive layer 44. The photo resist may be used as the etch mask 46 and the exposed portion by the etch mask 46 is a region where the isolation region will be formed. By using the etch mask 46, the silicon nitride layer 45, the first conductive layer 44 and the substrate 41 are etched to form a trench as shown in FIG. 7c. Thereafter, boron ions are implanted into the substrate 41 to form a channel stop region (not shown) under the trench 47, and the etch mask 46 is removed.

Figure 7D:
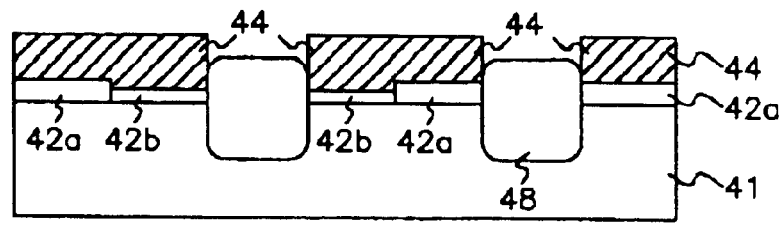
Figure 7E:
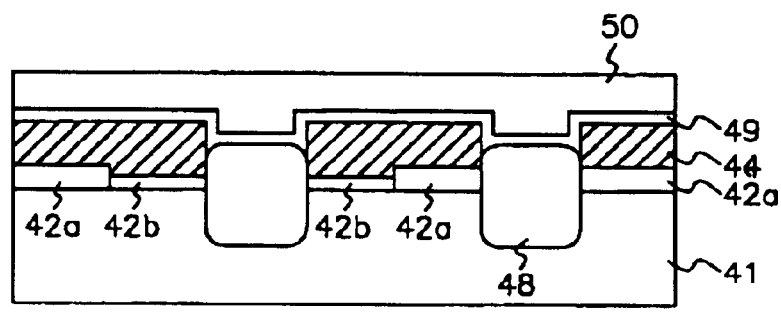

Next, oxidation is carried out to form high temperature oxide (HTO) layer (not shown) filling the trench 47. Then, the silicon nitride layer 45 and the HTO layer are polished by CMP (chemical Mechanical Polishing) to expose the first conductive layer 44. Then the polished HTO layer is etched back to expose side-walls of the first conductive layer 44 and to form a field oxide layer 48 as shown in FIG. 7d. The first conductive layer 44 with the exposed side-walls works as a floating gate of the unit cell of the flash EEPROM device. The exposed side-walls of the first conductive layer 44 increases the overlapping area of control gate and the floating gate, and thus enhances the GCR. Next, as shown in FIG. 7e, a dielectric layer 49 of ONO and a second conductive layer 50 composed of polysilicon with PoCl$_3$ and tungsten silicide are sequentially formed over the substrate where the field oxide layer 48 is formed. Thereafter, the first conductive layer 44, the dielectric layer 49 of ONO and the second conductive layer 50 are patterned along the word line, and the ion implantation is carried out to form a source and a drain, thereby forming a unit cell of the flash EEPROM device according to the present invention.

In the conventional art, the field oxide layer 48 of the isolation region is formed before forming a tunnel oxide layer corresponding to the dielectric layers 42a and 42b, and the first conductive layer 44 (the floating gate). However, in the present invention, the field oxide layer 48 of the isolation region is formed after the forming the dielectric layers 42a and 42b and the first conductive layer 44. Accordingly, the floating gate 44 is formed only on the active region defined by the field oxide layer 48 and does not overlap with the field oxide layer 48.

In fabricating the flash EEPROM device using the above-mentioned method, the gate dielectric layers of the drain selection transistor and the source selection transistor which are formed on the substrate together with the unit cells, may be made of dual gate dielectric layers having a thin layer and a thick layer. In this case, the process for manufacturing the flash EEPROM device is even more simplified. As previously described, the width of the isolation region of the flash EEPROM device according to the present invention can be remarkably reduced (about 20%) while maintaining GCR of the conventional flash EEPROM device.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A flash EEPROM unit cell comprising:
    a substrate on which field oxide layers are formed for isolating unit cells;
    a floating gate dielectric layer formed between the adjacent field oxide layers, wherein the floating gate dielectric layer includes a first dielectric layer and a second dielectric layer which are connected and positioned in parallel between a source and a drain formed on the substrate, and the thickness of the first dielectric layer is thicker than the second dielectric layer;

a floating gate formed on the floating gate dielectric layer;

a control gate dielectric layer formed on the floating gate; and a control gate formed on the control gate dielectric layer.

2. The flash EEPROM unit cell of claim 1, wherein the second dielectric layer works as a tunnel oxide layer for inducing an electron-injection into the floating gate and an electron-emission from the floating gate.

3. The flash EEPROM unit cell of claim 1, wherein the surface area of the first dielectric layer is substantially equal to that of the second dielectric layer.

4. The flash EEPROM unit cell of claim 1, wherein the thickness of the first dielectric layer is substantially equal to that of a dielectric layer of a peripheral devices formed in a flash EEPROM device to control the flash EEPROM device.

5. The flash EEPROM unit cell of claim 1, wherein the floating gate is formed only on the floating gate dielectric layer.

6. A flash EEPROM array architecture comprising:

a plurality of bit lines;

a plurality of word lines which intersect the plurality of bit lines; and a memory string including a plurality of unit cells serially connected to one of the bit lines, wherein each of the unit cells is connected to a respective word line, and the unit cell includes a first sub-cell and a second sub-cell connected and positioned in parallel between a source and a drain, and a capacitance of a dielectric layer under a floating gate of the first sub-cell is smaller than that of dielectric layer under a floating gate of the second sub-cell.

7. The flash EEPROM array architecture of claim 6, wherein the dielectric layer of the first sub-cell is thicker than that of the dielectric layer of the second sub-cell.

8. The flash EEPROM array architecture of claim 6, wherein a control gate of the first sub-cell and a control gate of the second sub-cell are connected to the same word line, and the floating gate of the first sub-cell is connected to the floating gate of the second sub-cell.

9. The flash EEPROM array architecture of claim 6, wherein the floating gate of the first sub-cell and the floating gate of the second sub-cell are connected together, and the control gate of the first sub-cell and the control gate of the second sub-cell are connected together.

10. The flash EEPROM array architecture of claim 6, wherein the floating gate of the first sub-cell and the floating gate of the second sub-cell are formed only between field oxide layers for separating the unit cells.

11. A flash EEPROM array architecture comprising:

a plurality of bit lines;

a plurality of word lines which intersect the plurality of bit lines; and a plurality of unit cells formed at the intersection of the bit lines and the word lines; wherein the unit cells at a row are connected to a word line; each of the unit cells includes a first sub-cell and a second sub-cell connected and positioned in parallel between a source and a drain; the sources of the unit cells are connected to a common source line; the drains of the unit cells at a column is connected to a bit line; and a capacitance of dielectric layer under a floating gate of the first sub-cell is smaller than that of dielectric layer under a floating gate of the second sub-cell.

12. The flash EEPROM array architecture of claim 11, wherein the dielectric layer of the first sub-cell is thicker than that of the dielectric layer of the second sub-cell.

13. The flash EEPROM array architecture of claim 11, wherein a control gate of the first sub-cell and a control gate of the second sub-cell are connected to the same word line, and the floating gate of the first sub-cell is connected to the floating gate of the second sub-cell.

14. The flash EEPROM array architecture of claim 11, wherein the floating gate of the first sub-cell and the floating gate of the second sub-cell are connected together and the control gate of the first sub-cell and the control gate of the second sub-cell are connected together.

15. The flash EEPROM array architecture of claim 11, wherein the floating gate of the first sub-cell and the floating gate of the second sub-cell are formed between adjacent field oxide layers for separating the unit cells.

* * * * *